(12) United States Patent
Zhang et al.

(10) Patent No.: US 12,250,853 B2
(45) Date of Patent: Mar. 11, 2025

(54) DISPLAY DEVICE WITH CONNECTED SHIELDING LAYER AND GATE ELECTRODE LAYER AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventors: Weibin Zhang, Wuhan (CN); Hong Liu, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 597 days.

(21) Appl. No.: 17/614,519

(22) PCT Filed: Nov. 4, 2021

(86) PCT No.: PCT/CN2021/128538
§ 371 (c)(1),
(2) Date: Nov. 27, 2021

(87) PCT Pub. No.: WO2023/070712
PCT Pub. Date: May 4, 2023

(65) Prior Publication Data
US 2023/0131235 A1    Apr. 27, 2023

(30) Foreign Application Priority Data
Oct. 25, 2021    (CN) .......................... 202111243099.4

(51) Int. Cl.
*H10K 59/126*    (2023.01)
*H01L 29/786*    (2006.01)
(Continued)

(52) U.S. Cl.
CPC ...... *H10K 59/126* (2023.02); *H01L 29/78672* (2013.01); *H01L 29/78696* (2013.01); *H10K 59/122* (2023.02); *H10K 59/1201* (2023.02)

(58) Field of Classification Search
CPC ............... H10K 59/126; H10K 59/122; H10K 59/1201; H10K 2102/311;
(Continued)

(56) References Cited

U.S. PATENT DOCUMENTS 11,830,881 B2* 11/2023 Duan .................. H01L 29/7869
2007/0057280 A1* 3/2007 Hayashi .............. H01L 29/7833
257/E29.267
(Continued)

FOREIGN PATENT DOCUMENTS

CN    201438464 U    4/2010
CN    104977764 A    10/2015
(Continued)

*Primary Examiner* — Mamadou L Diallo
(74) *Attorney, Agent, or Firm* — The Roy Gross Law Firm, LLC; Roy Gross

(57) ABSTRACT

A display device and a manufacturing method thereof are provided. The display device includes a substrate, a shielding layer, a semiconductor layer, and a first gate electrode layer. The shielding layer is disposed on a side of the substrate. The semiconductor layer is disposed on a side of the shielding layer away from the substrate. The shielding layer is at least partially overlapped with the semiconductor layer. The first gate electrode layer is disposed on a side of the semiconductor layer away from the substrate. The first gate electrode layer is at least partially overlapped with the semiconductor layer and is electrically connected to the
(Continued)

shielding layer. The manufacturing method of the display device is used to manufacture the display device.

18 Claims, 9 Drawing Sheets

(51) Int. Cl.
*H10K 59/12* (2023.01)
*H10K 59/122* (2023.01)

(58) Field of Classification Search
CPC ......... H01L 29/78633; H01L 29/78672; H01L 29/78696; H01L 29/78648
See application file for complete search history.

(56) References Cited

U.S. PATENT DOCUMENTS

| | | | | |
|---|---|---|---|---|
| 2011/0024754 | A1* | 2/2011 | Yamazaki | G02F 1/136204 |
| | | | | 257/E33.053 |
| 2015/0270299 | A1* | 9/2015 | Gao | H01L 27/14623 |
| | | | | 257/66 |
| 2016/0370621 | A1* | 12/2016 | Huang | G02F 1/1368 |
| 2017/0062542 | A1* | 3/2017 | Jung | H10K 50/805 |
| 2017/0162822 | A1* | 6/2017 | Park | H10K 59/87 |
| 2018/0083049 | A1* | 3/2018 | Sakata | H01L 27/1225 |
| 2019/0214504 | A1* | 7/2019 | Song | H01L 27/124 |
| 2019/0296055 | A1* | 9/2019 | Lius | G02F 1/1368 |
| 2020/0044093 | A1* | 2/2020 | Liu | H01L 29/78675 |
| 2020/0243566 | A1* | 7/2020 | Liu | H01L 27/1218 |
| 2020/0411624 | A1* | 12/2020 | Gu | H01L 29/7869 |
| 2021/0183977 | A1* | 6/2021 | Xiao | H01L 28/60 |
| 2021/0265441 | A1* | 8/2021 | Wang | H10K 59/126 |
| 2021/0359063 | A1* | 11/2021 | Lu | H01L 27/1225 |
| 2021/0384224 | A1* | 12/2021 | Tian | H01L 27/1262 |
| 2022/0165826 | A1* | 5/2022 | Hanada | H10K 59/126 |
| 2022/0223674 | A1* | 7/2022 | Liu | H10K 59/1201 |
| 2022/0254933 | A1* | 8/2022 | Huang | H01L 29/7869 |
| 2022/0328532 | A1* | 10/2022 | Ozeki | H01L 27/1244 |
| 2023/0013050 | A1* | 1/2023 | Zhang | H10K 59/122 |
| 2024/0030223 | A1* | 1/2024 | Lu | H01L 27/124 |

FOREIGN PATENT DOCUMENTS

| | | | | |
|---|---|---|---|---|
| CN | 107452809 | A | | 12/2017 |
| CN | 107623042 | A | | 1/2018 |
| CN | 108257977 | A * | 7/2018 | ......... H01L 27/1218 |
| CN | 109585300 | A | | 4/2019 |
| CN | 109801952 | A | | 5/2019 |
| CN | 109801954 | A | | 5/2019 |
| CN | 110061034 | A | | 7/2019 |
| CN | 111063692 | A | | 4/2020 |
| CN | 111312722 | A | | 6/2020 |
| CN | 210805780 | U | | 6/2020 |
| CN | 111725244 | A | | 9/2020 |
| CN | 112086485 | A | | 12/2020 |
| CN | 213150776 | U | | 5/2021 |
| CN | 113013180 | A | | 6/2021 |
| JP | 2005252188 | A | | 9/2005 |

* cited by examiner

DISPLAY DEVICE WITH CONNECTED SHIELDING LAYER AND GATE ELECTRODE LAYER AND MANUFACTURING METHOD THEREOF

CROSS REFERENCE TO RELATED APPLICATIONS

This application is a National Phase of PCT Patent Application No. PCT/CN2021/128538 having International filing date of Nov. 4, 2021, which claims the benefit of priority of Chinese Patent Application No. 202111243099.4, filed Oct. 25, 2021, the contents of which are all incorporated herein by reference in their entirety.

BACKGROUND OF INVENTION

Field of Invention

The present application relates to a field of display technology, and particularly to a display device and a manufacturing method thereof.

Description of Prior Art

Organic light-emitting diode screens, such as active-matrix organic light-emitting diode (AMOLED) screens, are widely used in small and medium size displays. The AMOLED screens have advantages of light weights and high color gamut values. Because the AMOLED screens are driven by electric current controlled by thin film transistor (TFTs), requirement of reliability of TFTs is high. Generally, organic flexible substrates, such as polyimide flexible substrates, are disposed under the TFTs, which are affected by charges on the organic flexible substrates, causing poor reliability on the TFTs, for example, generating a hysteresis phenomenon.

However, in the prior art, shielding layers are generally disposed in a floating manner. This configuration manner has poor shielding effect, increases parasitic capacitor, and increases power consumption, which is prone to makes electrical properties of the TFTs shift, causing the AMOLED screens to have many problems and to have a low transmittance rate.

In addition, there is also shielding layer connected to a working voltage (Vdd) in the prior art, for example, connected to a working voltage of 4.6V. This method easily affects a threshold voltage (Vth) of the TFTs, which increases the parasitic capacitance and causes increment of load and decrement of a transmittance on the AMOLED screens during operation.

In the prior art, even if the shielding layer is disposed in the floating manner or the shielding layer is connected to the working voltage, the organic light-emitting transistor screens of the prior art has a technical problem of poor reliability of the TFTs.

SUMMARY OF INVENTION

In order to solve the aforesaid technical problem, a shielding layer is disposed under a thin film transistor and is connected to a gate electrode of the thin film transistor in the present application. This manner can effectively shield influence of charges of a flexible substrate on thin film transistors, can improve reliability of the thin film transistors, and can increase the turned-on current of the thin film transistors.

On the basis of the aforesaid purpose, the present application provides a display device, including a substrate, a shielding layer, a semiconductor layer, and a first gate electrode layer. The shielding layer is disposed on a side of the substrate. The semiconductor layer is disposed on a side of the shielding layer away from the substrate. The shielding layer is at least partially overlapped with the semiconductor layer. The first gate electrode layer is disposed on a side of the semiconductor layer away from the substrate. The first gate electrode layer is at least partially overlapped with the semiconductor layer and is electrically connected to the shielding layer.

In one embodiment of the present application, the display device includes a driving circuit. Each of the driving circuits includes a plurality of thin film transistors. Each of the thin film transistors includes a semiconductor section disposed corresponding to the semiconductor layer. The semiconductor section of at least part of the thin film transistors is overlapped with the shielding layer.

In one embodiment of the present application, each of the driving circuit includes first thin film transistors and second thin film transistors. The semiconductor section of the first thin film transistors is overlapped with the shielding layer. Transistor types of the first thin film transistors and the second thin film transistors are different.

In one embodiment of the present application, the first thin film transistors are low-temperature polycrystalline-silicon thin film transistors, the second thin film transistors are low-temperature polycrystalline-oxide thin film transistors, and the semiconductor section of the second thin film transistors is not overlapped with the shielding layer.

In one embodiment of the present application, the semiconductor section includes a channel region overlapped with the first gate electrode layer, and the channel region of at least part of the thin film transistors is overlapped with the shielding layer.

In one embodiment of the present application, a part where the shielding layer overlaps the semiconductor layer and a part where the first gate electrode layer overlaps the semiconductor layer are in a same shape.

In one embodiment of the present application, the shielding layer and the first gate electrode layer are in a same shape.

In one embodiment of the present application, the display device further includes a buffer layer and a plurality of functional layers, the buffer layer is disposed on the substrate and covers the shielding layer, the semiconductor layer is disposed on the buffer layer, and the plurality of functional layers are disposed on the buffer layer and covers the semiconductor layer.

In one embodiment of the present application, a connection hole is defined in at least one of the functional layers and the buffer layer, and the first gate electrode layer is connected to the shielding layer through the connection hole.

In one embodiment of the present application, the plurality of functional layers includes: a first gate insulation layer disposed on the buffer layer and covering the semiconductor layer; the first gate electrode layer disposed on the first gate insulation layer and connected to the shielding layer; a second gate insulation layer disposed on the first gate insulation layer and covering the first gate electrode layer; a second gate electrode layer disposed on the second gate insulation layer; an interlayer insulation layer disposed on the second gate insulation layer and covering the second gate electrode layer; an electrode layer disposed on the interlayer insulation layer and connected to the semiconductor layer; a planarization layer disposed on the interlayer insulation layer and covering the electrode layer; an anode layer disposed on the planarization layer and connected to the electrode layer; a pixel definition layer disposed on the planarization layer and covering part of the anode layer; and a plurality of spacers disposed on the pixel definition layer. The thin film transistor includes the first gate electrode layer, the second gate electrode layer, and the gate electrode layer. The electrode layer includes a source electrode and a drain electrode.

In one embodiment of the present application, a plurality of second connection holes are defined in the second gate insulation layer and the interlayer insulation layer, and the source electrode and the drain electrode are connected to the semiconductor layer through the plurality of second connection holes.

In one embodiment of the present application, a third connection hole is defined in the planarization layer, the anode layer is connected to the electrode layer through the third connection hole.

In one embodiment of the present application, the display device includes an organic light-emitting layer disposed on the plurality of functional layers.

In one embodiment of the present application, the display device includes a cathode layer disposed on the organic light-emitting layer.

In one embodiment of the present application, the display device further includes a driving component electrically connected to the anode layer, the cathode layer, and the thin film transistor.

In one embodiment of the present application, the shielding layer and the first gate electrode layer has a same electric potential.

In one embodiment of the present application, the shielding layer includes at least one metal film layer, the at least one metal film layer is made of at least one or more of molybdenum, titanium, aluminum, silicon, a semiconductor material, or a transparent conductive material.

In one embodiment of the present application, an area of the shielding layer is greater than an area of the first gate electrode layer.

The present application further provides a manufacturing method of a display device, including:

disposing a substrate; disposing a shielding layer on a side of the substrate; disposing a semiconductor layer on a side of the shielding layer away from the substrate; and disposing a first gate electrode layer on a side of the semiconductor layer away from the substrate, wherein the shielding layer is at least partially overlapped with the semiconductor layer; and the first gate electrode layer is at least partially overlapped with the semiconductor layer and is electrically connected to the shielding layer, and the shielding layer and the first gate electrode layer are made by a same photomask.

In one embodiment of the present application, an area of the shielding layer is greater than an area of the first gate electrode layer, and the area of the shielding layer and the area of the first gate electrode layer are controlled by photo dose.

In the present application, disposing the shielding layer under the thin film transistor and connecting the shielding layer to a gate electrode of the thin film transistor, beneficial effect of being able to effectively shield influence of charges of a flexible substrate on thin film transistors, being able to improve reliability of the thin film transistors, and being able to increase the turned-on current of the thin film transistors can be provided.

DETAILED DESCRIPTION OF EMBODIMENTS

Figure 1:
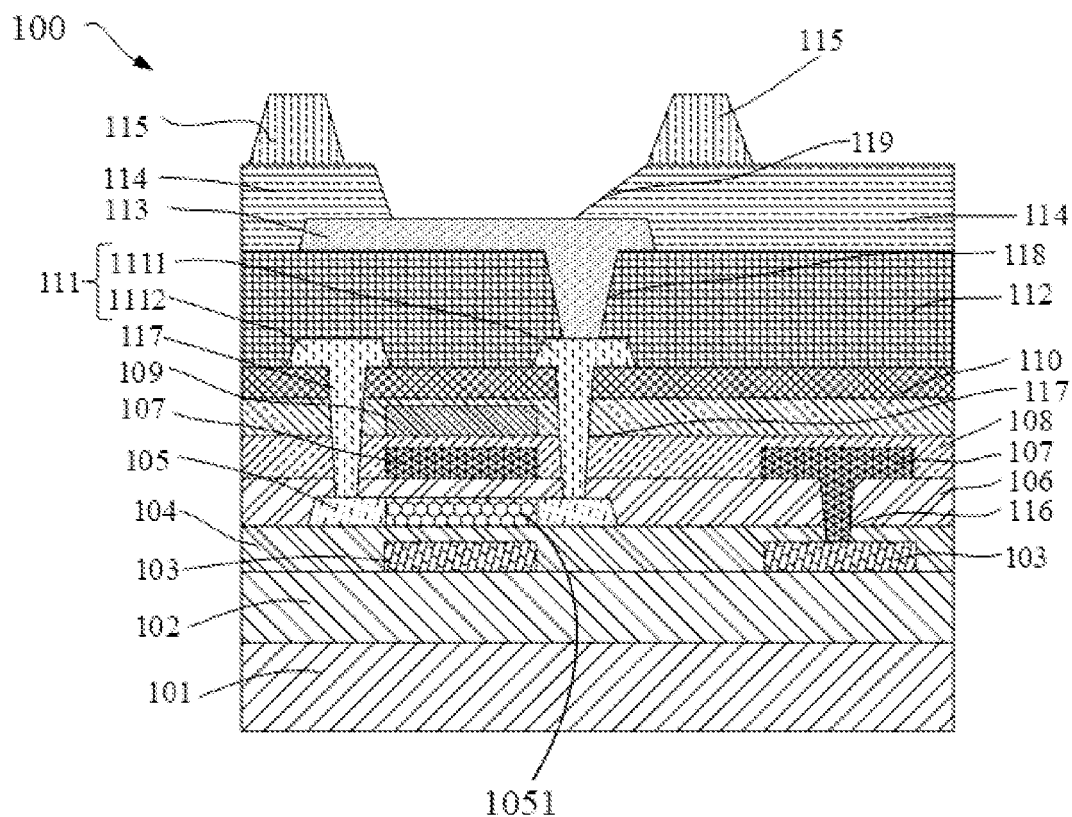
FIG. 1 is a first schematic diagram of manufacturing processes of a display device provided by the present application.
Figure 2:
FIG. 2 is a second schematic diagram of the manufacturing processes of the display device provided by the present application.

In order to allow the above and other purposes, features, and advantages of the present application to be more obvious and easier to understand, preferred embodiments of the present application will be particularly described hereinafter, and with reference to the accompanying drawings, a detailed description will be given below. Moreover, the directional terms of which the present application mentions, for example, "upper", "lower", "top", "bottom", "front", "rear", "left", "right", "inside", "outside", "side", "circumference", "center", "horizontal", "vertical", "axial", "radial", "top layer", "bottom layer", etc., only refer to directions of the accompanying figures. Therefore, the used directional terms are for illustrating and understanding the present application, but not for limiting the present application.

In the figures, units with similar structures are indicated by the same reference numerals.

Figure 15:
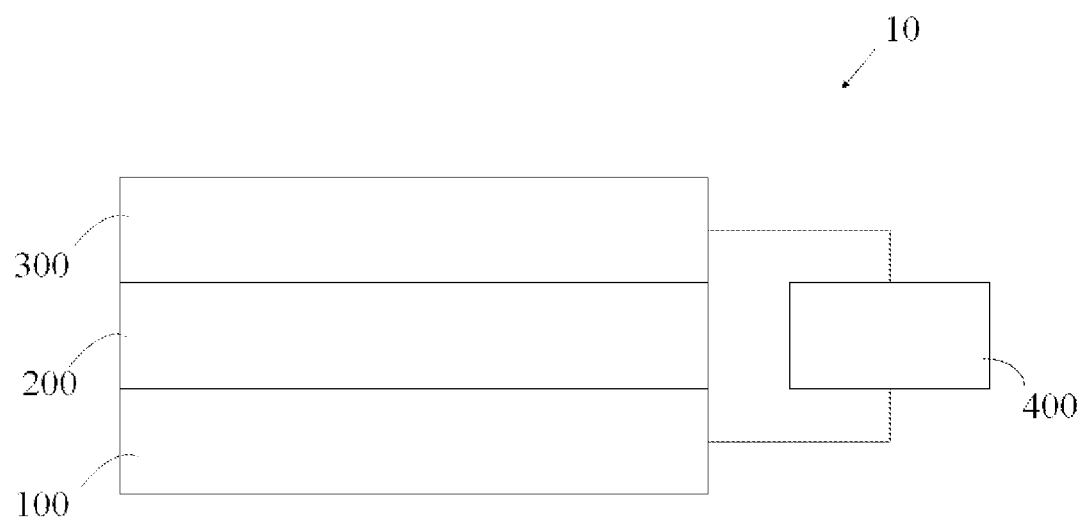
FIG. 15 is a schematic diagram of the display device of the present application.

As illustrated in FIG. 1, a display device 10 of the present application can at least include a substrate 101, a shielding layer 103, a semiconductor layer 105, and a first gate electrode layer 107. In FIG. 15, the shielding layer 103 is disposed on a side of the substrate 101; the semiconductor layer 105 is disposed on a side of the shielding layer 103 away from the substrate; the shielding layer 103 is at least partially overlapped with the semiconductor layer 105; the first gate electrode layer 107 is disposed on a side of the semiconductor layer 105 away from the substrate 101; and the first gate electrode layer 107 is at least partially overlapped with the semiconductor layer 105 and is electrically connected to the shielding layer 103.

As the shielding layer 103 is disposed under the semiconductor layer 105 of the thin film transistor and is connected to a gate electrode of the thin film transistor, influence of charges of a flexible substrate on the thin film transistor can be effectively shielded, reliability of the thin film transistor can be improved, and the turned-on current of the thin film transistor can be increased.

Furthermore, as illustrated in FIG. 1 to FIG. 14, the display device 10 can be manufactured by the following methods.

S101: disposing a substrate 101.

S102: disposing a barrier layer 102 on the substrate 101.

S103: disposing a shielding layer 103 on the barrier layer 102.

S104: disposing a buffer layer 104 on the barrier layer 102, and covering the shielding layer 103 by the buffer layer 104.

S105: disposing a semiconductor layer 105 on the buffer layer 104.

S106: disposing a first gate insulation layer 106 on the buffer layer 104, and covering the semiconductor layer 105 by the first gate insulation layer 106.

S107: disposing a first gate electrode layer 208 on the first gate insulation layer 106, and connecting the first gate electrode layer 107 to the shielding layer 103.

S108: disposing a second gate insulation layer 108 on the first gate insulation layer 106, and covering the second gate insulation layer 108 by the first gate insulation layer 107.

S109: disposing a second gate electrode 109 on the second gate insulation layer 108.

S110: disposing an interlayer insulation layer 110 on the second gate insulation layer 108, and covering the second gate electrode layer 109 by the interlayer insulation layer 110.

S111: disposing an electrode layer 111 on the interlayer insulation layer 110, and connecting the electrode layer 111 to the semiconductor layer 105.

S112: disposing a planarization layer 112 on the interlayer insulation layer 110, and covering the electrode layer 111 by the planarization layer 112.

S113: disposing an anode layer 113 on the planarization layer 112, and connecting the anode layer 113 to the electrode layer 111.

S114: disposing a pixel definition layer 114 on the planarization layer 112, covering part of the anode layer 113 by the pixel definition layer 114, and disposing a plurality of spacers 115 on the pixel definition layer 114.

After the step S114 is finished, an organic light-emitting layer 200 and a cathode layer 300 can be disposed on a display structure 100 as illustrated in FIG. 15. In addition, for convenience of description, film layers disposed under the organic light-emitting layer 200 are collectively referred to as the display structure 100.

As illustrated in FIG. 15, the display device 10 of the present application can include the display structure 100, the organic light-emitting layer 200, the cathode layer 300, and a driving component 400. The organic light-emitting layer 200 is disposed on the display structure 100. The cathode layer 300 is disposed on the organic light-emitting layer 200. The driving component 400 can be electrically connected to the display structure 100 and the cathode layer 300. The display structure includes a plurality of film layers, such as, the substrate 101, the barrier layer 102, etc. The driving component 400 can be connected to the anode layer 113, the cathode layer 300, and a thin film transistor in the display structure 100 to form the display device 10.

The display device 10 of the present application can be a computer screen, a mobile phone screen, etc. with a display function, which is not limited thereto. The organic light-emitting layer 200 can include organic light-emitting transistors. The driving component 400 can include components such as a driving circuit and a driving chip.

Furthermore, as illustrated in FIG. 1, the display device 10 includes the substrate 10, the barrier layer 102, the shielding layer 103, the barrier layer 104, and a plurality of functional layers.

In the step S101, the substrate 101 can be a flexible substrate. Specifically, the substrate 101 can be made of polyimide (PI). In other embodiment, the substrate 101 can be made of other materials according to requirements.

Figure 3:
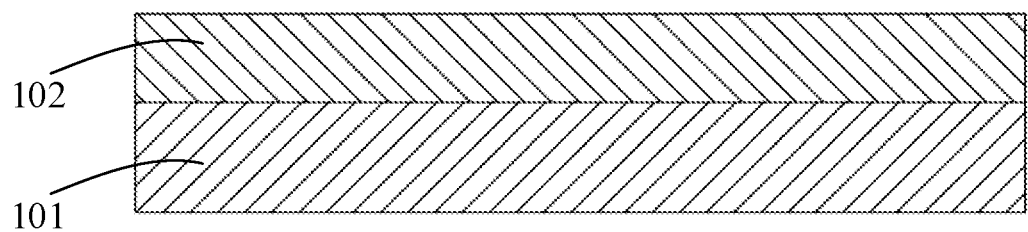
FIG. 3 is a third schematic diagram of the manufacturing processes of the display device provided by the present application.

In the step S102, as illustrated in FIG. 3, the barrier layer 102 is disposed on the substrate 101. In one embodiment, the barrier layer 102 can include metal oxide, and can also include other materials, for example, the barrier layer 102 can include silicon nitride, which is not limited thereto.

Figure 4:
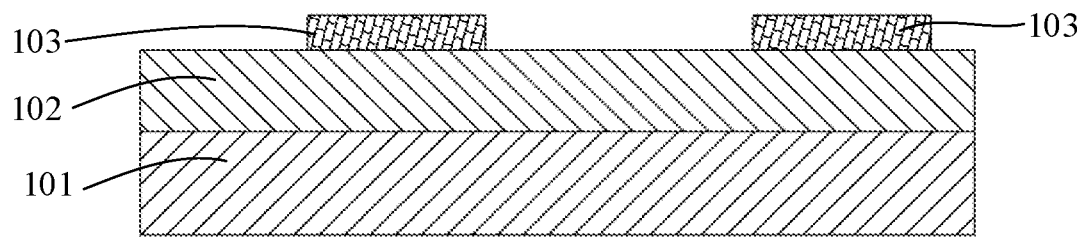
FIG. 4 is a fourth schematic diagram of the manufacturing processes of the display device provided by the present application.

In the step S103, as illustrated in FIG. 4, the shielding layer 103 can be disposed on the barrier layer 102 by processes such as deposition, photoresist coating, exposure, etching, etc. Furthermore, in one embodiment, the shielding layer 103 includes at least one metal film layer. Specifically, the shielding layer 103 includes one or more of molybdenum, titanium, aluminum, silicon, a semiconductor material, or a transparent conductive material.

Figure 16:
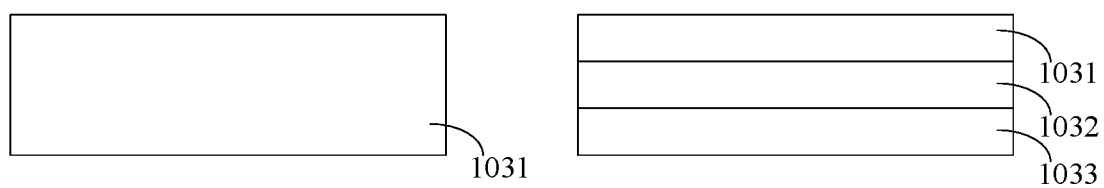
FIG. 16 is a schematic diagram of a shielding layer of the display device of the present application.

As illustrated on left side in FIG. 16, the shielding layer 16 can only include a first metal film layer 1031. The first metal film layer 1031 can be made of one of molybdenum, titanium, aluminum, silicon, a semiconductor material, or a transparent conductive material. As illustrated on right side in FIG. 16, the shielding layer 103 can include a first metal film layer 1031, a second metal film layer 1032, and a third metal film layer 1033. The first metal film layer 1031, the second metal film layer 1032, and the third metal film layer 1033 can be made of one or more of molybdenum, titanium, aluminum, silicon, a semiconductor material, or a transparent conductive material, which is not limited thereof. For example, the first metal film layer 1031 can be made of titanium, the second metal film layer 1032 can be made of aluminum, and the third metal film layer 1033 can be made of titanium.

Figure 5:
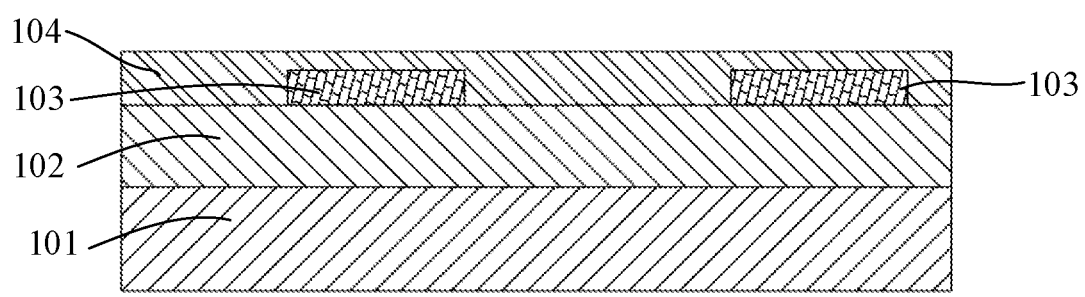
FIG. 5 is a fifth schematic diagram of the manufacturing processes of the display device provided by the present application.

In the step S104, as illustrated in FIG. 5, the buffer layer 104 can be disposed on the barrier layer 102 and covers the shielding layer 103. In one embodiment, the buffer layer 104 can be made of one or more of silicon nitride, or silica.

The plurality of functional layers are disposed on the buffer layer 104 and covers the semiconductor layer 105. Specifically, as illustrated in FIG. 15, the plurality of functional layers include a first gate insulation layer 106, a first gate electrode layer 107, a second gate insulation layer 108, a second gate electrode layer 109, an interlayer insulation layer 110, an electrode layer 111, a planarization layer 112, an anode layer 113, a pixel definition layer 114, and a plurality of spacers 115.

Furthermore, a thin film transistor is formed in the plurality of functional layers, and the thin film transistor includes the first gate electrode layer 107, a semiconductor layer 105, the second gate electrode layer 109, and the electrode layer 111. Wherein, the electrode layer 111 includes a source electrode 1111 and a drain electrode 1112. In addition, the first gate electrode layer 107 is connected to the shielding layer 103, and the shielding layer 103 and the thin film transistor are located in an active region of the display device 10.

Figure 6:
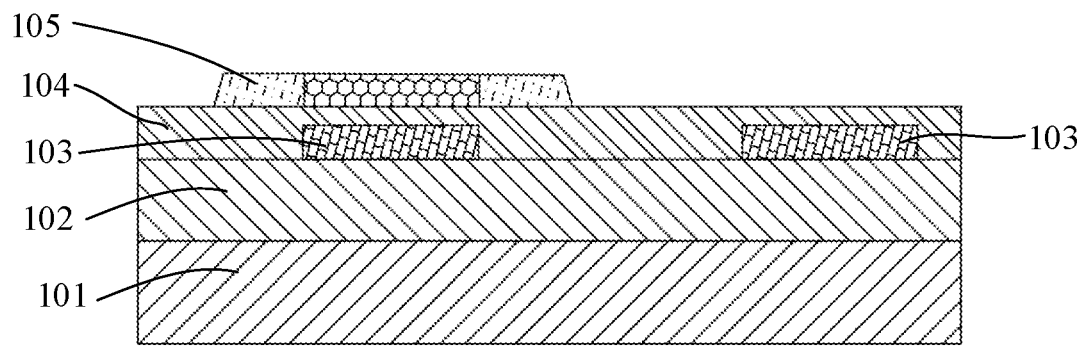
FIG. 6 is a sixth schematic diagram of the manufacturing processes of the display device provided by the present application.

In the step S105, as illustrated in FIG. 6, the semiconductor layer 105 is disposed on the buffer layer 104 to act as a semiconductor channel of the thin film transistor. In one embodiment, the semiconductor layer 105 can be made of a semiconductor material, for example, can be made of polycrystalline silicon.

Figure 7:
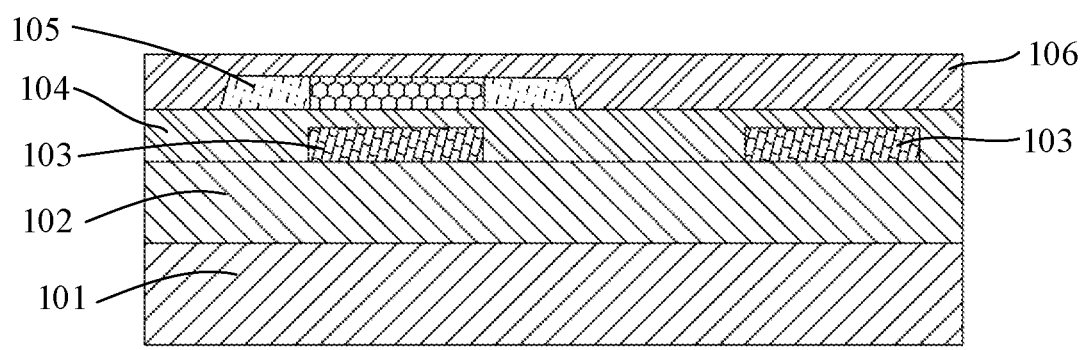
FIG. 7 is a seventh schematic diagram of the manufacturing processes of the display device provided by the present application.

In the step S106, as illustrated in FIG. 7, the first gate insulation layer 106 can be disposed on the buffer layer 104 and covers the semiconductor layer 105 by processes such as deposition, photoresist coating, exposure, etching, etc.

Figure 8:
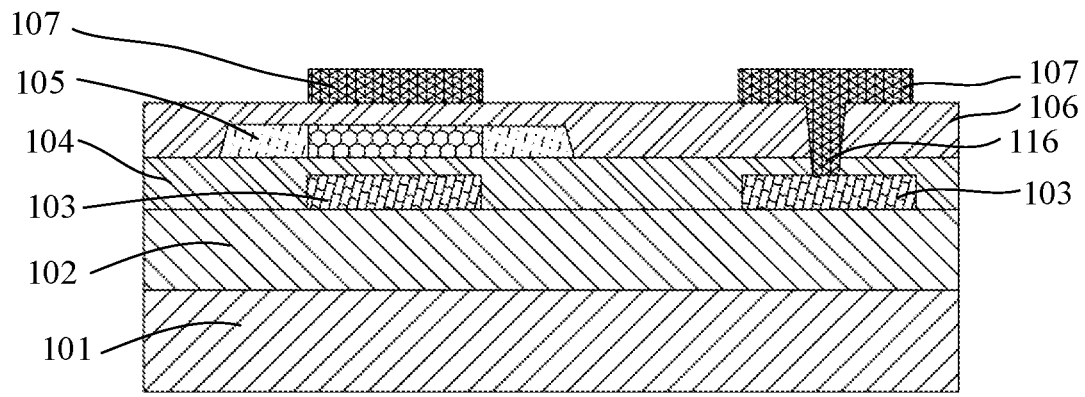
FIG. 8 is an eighth schematic diagram of the manufacturing processes of the display device provided by the present application.

In the step S107, as illustrated in FIG. 8, the first gate electrode layer 107 can be disposed on the first gate insulation layer 106 and is connected to the shielding layer 103 by processes such as deposition, photoresist coating, exposure, etching, etc.

In one embodiment, a connection hole is defined in at least one functional layers and the buffer layer 104. The first gate electrode layer 107 is connected to the shielding layer 103 through the connection hole.

For example, after the first gate insulation layer 106 has been disposed, a first connection hole 116 can be defined in the buffer layer 104 and the first gate insulation layer 106 by an etching method. The first gate electrode layer 107 can be connected to the shielding layer 103 through the first connection hole 116, and the shielding layer 103 and the first gate electrode layer 107 have same electric potential. Therefore, the shielding layer 103 can act as bottom electrode of the thin film transistor.

Figure 9:
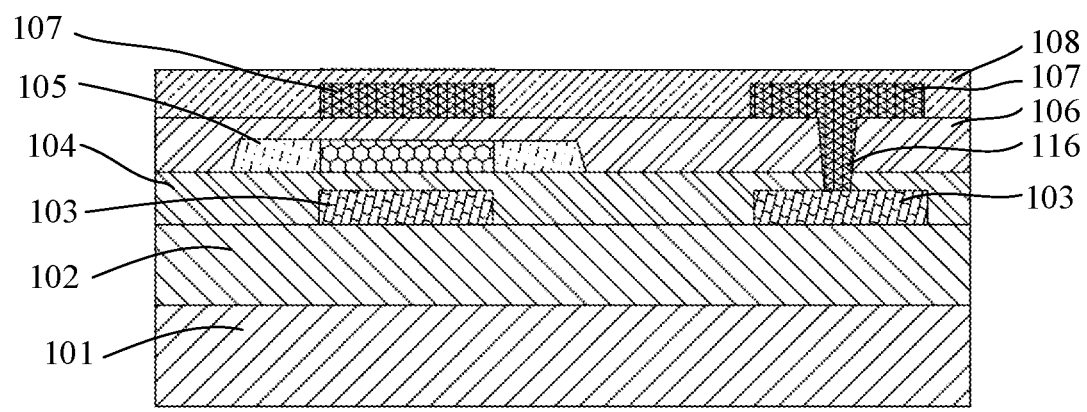
FIG. 9 is a ninth schematic diagram of the manufacturing processes of the display device provided by the present application.

In the step S108, as illustrated in FIG. 9, the second gate insulation layer 108 can be disposed on the first gate insulation layer 106 by a deposition method and covers the first gate electrode layer 107.

Figure 10:
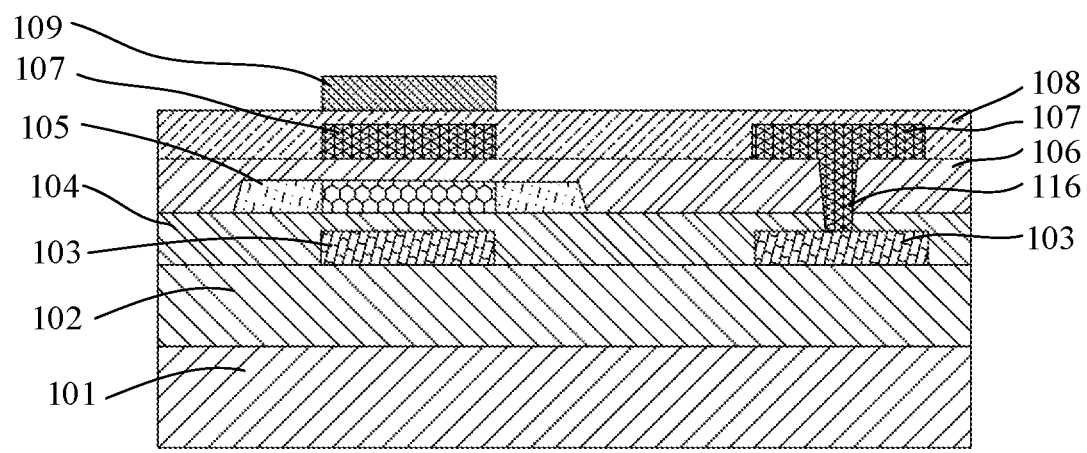
FIG. 10 is a tenth schematic diagram of the manufacturing processes of the display device provided by the present application.

In step S109, as illustrated in FIG. 10, the second gate electrode layer 109 can be disposed on the second gate insulation layer 108 by processes such as deposition, photoresist coating, exposure, etching, etc.

Figure 11:
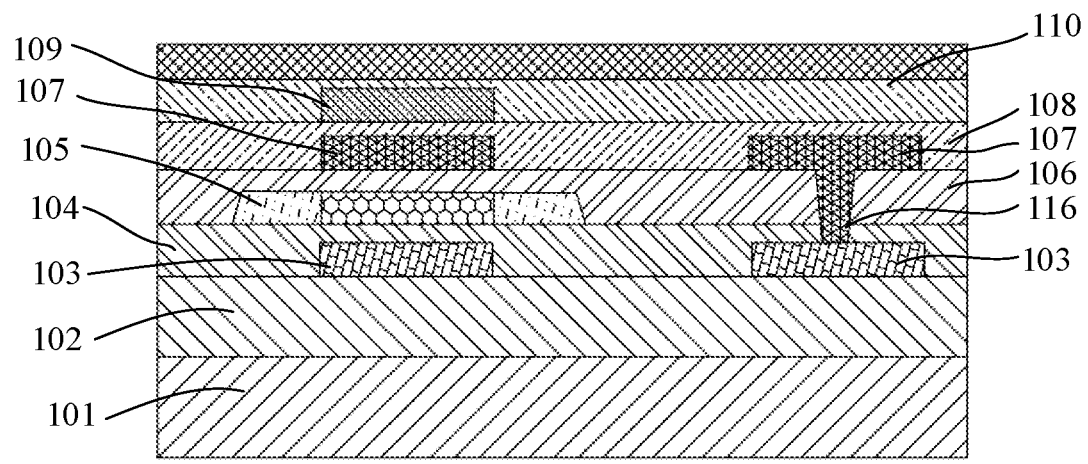
FIG. 11 is a eleventh schematic diagram of the manufacturing processes of the display device provided by the present application.

In the step S110, as illustrated in FIG. 11, the interlayer insulation layer 110 can be disposed on the second gate insulation layer 108 and covers the second gate electrode layer 109 by a deposition method. In one embodiment, the interlayer insulation layer 110 can be made of one or more of silicon nitride, or silica.

Figure 12:
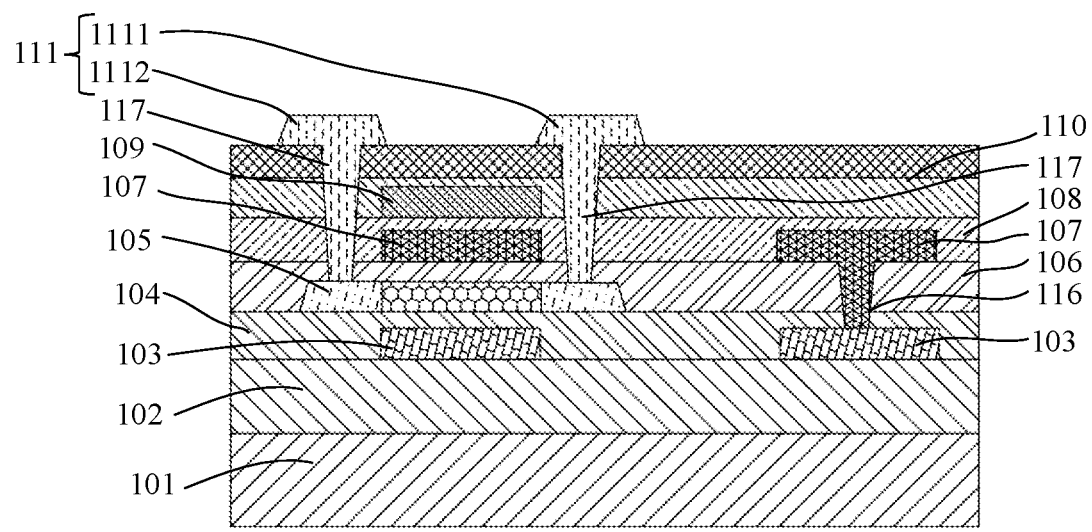
FIG. 12 is a twelfth schematic diagram of the manufacturing processes of the display device provided by the present application.

In the step S111, as illustrated in FIG. 12, the electrode layer 111 is disposed on the interlayer insulation layer 110 and is connected to the semiconductor layer 105. Furthermore, after the step S110 is finished, a plurality of second connection holes 117 are defined in the first gate insulation layer 106, the second gate insulation layer 108, and the interlayer insulation layer 110. The source electrode 1111 and the drain electrode 1112 can be connected to the semiconductor layer 105 through a plurality of second connection holes 117.

Figure 13:
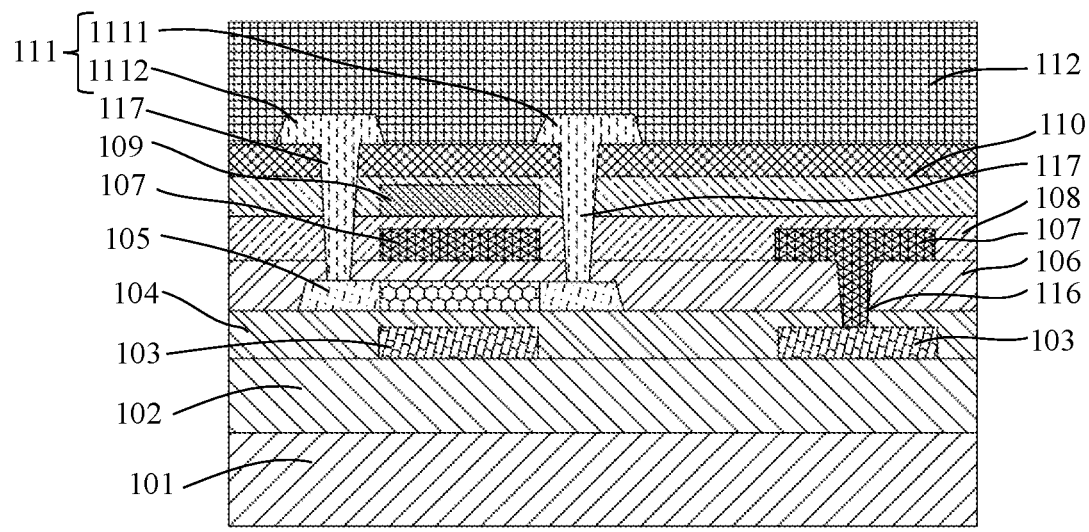
FIG. 13 is a thirteenth schematic diagram of the manufacturing processes of the display device provided by the present application.

In the step S112, as illustrated in FIG. 13, the planarization layer 12 is disposed on the interlayer insulation layer 110 and covers the electrode layer 111.

Figure 14:
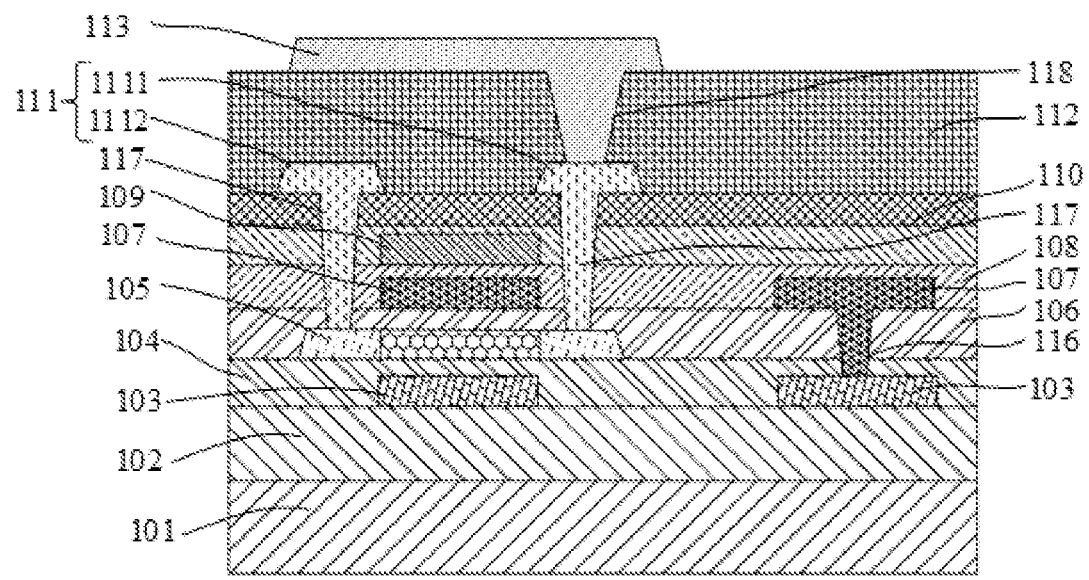
FIG. 14 is a fourteenth schematic diagram of the manufacturing processes of the display device provided by the present application.

In the step S113, as illustrated in FIG. 14, the anode layer 113 is disposed on the planarization layer 112 and is connected to the electrode layer 111. Furthermore, after the step S112 is finished, a third connection hole 118 can be defined in the planarization layer 112. The anode layer 113 can be connected to the electrode layer 111 through the third connection hole 118. Furthermore, in the step S114, as illustrated in FIG. 15, the pixel definition layer 114 is disposed on the planarization layer 112 and covers part of the anode layer 113. The plurality of spacers 115 are disposed on the pixel definition layer 114.

In one embodiment, a same first photomask can be used to manufacture the shielding layer 103 and the first gate electrode layer 107; a second photomask can be used to manufacture the semiconductor layer 105; a third photomask can be used to define the first connection hole 116; and a fourth photomask can be used to manufacture the second gate electrode layer 109. In other embodiment, different photomasks can also be used to make the shielding layer 103 and the first gate electrode layer 107, i.e., patterns of the shielding layer 103 and the first gate electrode layer 107 can be the same or different.

Figure 17:
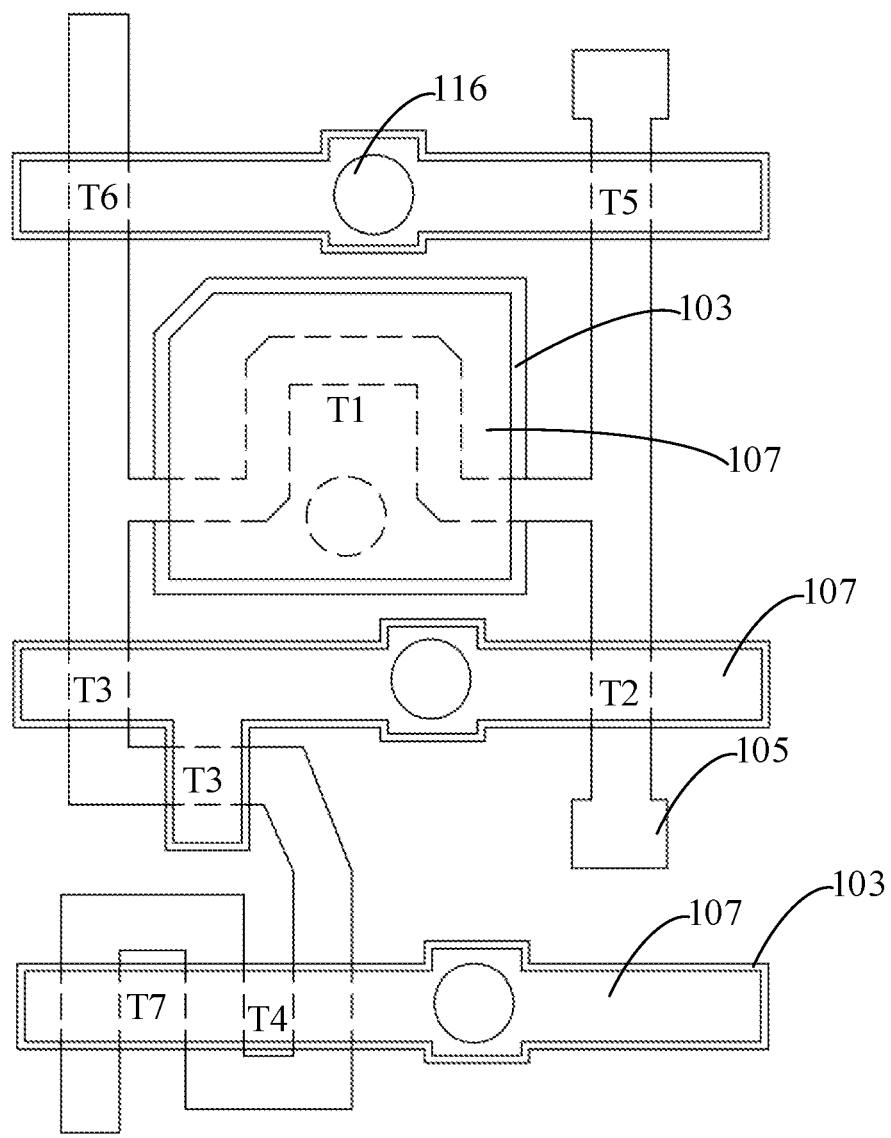
FIG. 17 is a top view of a circuit of the display device of the present application.
Figure 18:
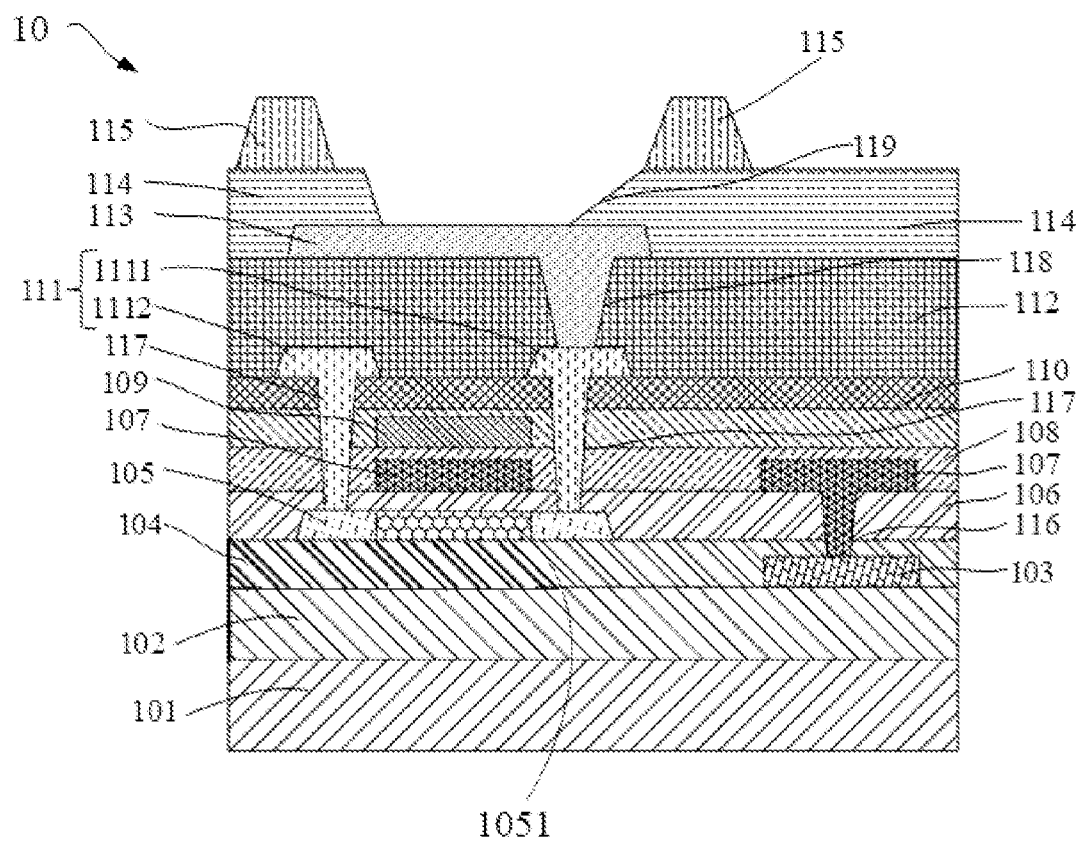
FIG. 18 is a fifth schematic diagram of the display device of the present application.

In one embodiment, the display device 10 includes a driving circuit. As illustrated in FIG. 17 and FIG. 18, each driving circuit can include a plurality of thin film transistors T1-T7, the thin film transistor includes a semiconductor section 1051 disposed corresponding to the semiconductor layer 105. The semiconductor section 1051 of at least part of the thin film transistors is overlapped with the shielding layer 103. That is, the semiconductor section 1051 corresponds to positions of the plurality of thin film transistors T1-T7, and is a part of the semiconductor layer 105.

In one embodiment, each of the driving circuit includes first thin film transistors and second thin film transistors. The semiconductor section 1051 of the first thin film transistors is overlapped with the shielding layer 103. Transistor types of the first thin film transistors and the second thin film transistors are different.

Furthermore, the first thin film transistor is a low-temperature polycrystalline-silicon thin film transistor, and the second thin film transistor is a metal oxide thin film transistor. In addition, as illustrated in FIG. 18, the semiconductor section 1051 of the second thin film transistors is not overlapped with the shielding layer 103.

In one embodiment, as illustrated in FIG. 17, in the display device 10 of the present application, seven thin film transistors can be included. The thin film transistor in FIG. 1 to FIG. 14 can be the first thin film transistor.

In another embodiment, the first gate electrode layer 107 of any thin film transistor T1-T7 can be connected to the shielding layer 103. That is, all the thin film transistors can also be overlapped with the shielding layer 103.

In one embodiment, as illustrated in FIG. 1, the semiconductor section 1051 includes a channel region overlapped with the first gate electrode layer 107, and the channel region of at least part of the thin film transistors is overlapped with the shielding layer 103.

In one embodiment, an area of the shielding layer 103 is greater than an area of the first gate electrode layer 107 in FIG. 17, and the area of the shielding layer 103 and the area of the first gate electrode layer 107 are controlled by photo dose during production.

Furthermore, as illustrated in FIG. 17, a part where the shielding layer 103 overlaps the semiconductor layer 105 and a part where the first gate electrode layer 107 overlaps the semiconductor layer 105 are in a same shape. In addition, it can also be understood that the shielding layer 103 and the first gate electrode layer 107 are in a same shape from FIG. 17.

In summary, in the present application, the shielding layer 103 similar to the first gate electrode layer 107 is disposed under the thin film transistor and is overlapped with the first gate layer 107, and the shielding layer 103 can act as a bottom gate of the thin film transistor. This configuration method can increase a turned-on current of the thin film transistor and can increase quality of the panel. In addition, the shielding layer 103 can shield a film layer located under the shielding layer 103, such as the substrate 101 made of polyimide, etc.

Furthermore, because the shielding layer 103 is integrated with the first gate electrode layer 107, a same mask can be used when the shielding layer and the first gate electrode layer are manufactured. Therefore, influence of the shielding layer 103 on the transmittance can also be reduced. In addition, it should be noted that the area of the shielding layer 103 can be controlled by the photo dose during production.

The shielding layer 103 and the first gate electrode layer 107 of the present application has the same electric potential, which not only has a better shielding effect than the shielding layer in the prior art, but there is also no parasitic capacitance between the shielding layer 103 and the first gate electrode layer 107, which allows the reliability of the thin film transistor to be more stable.

Although the disclosure has been shown and described with respect to one or more implementations, equivalent alterations and modifications will occur to others skilled in the art based upon a reading and understanding of this specification and the annexed drawings. The disclosure includes all such modifications and alterations, and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such features may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

Which mentioned above is preferred embodiments of the present application, it should be noted that to those skilled in the art without departing from the technical theory of the present application, can further make many changes and modifications, and the changes and the modifications should be considered as the scope of protection of the present application.

What is claimed is:

1. A display device, comprising:
    a substrate;
    a shielding layer disposed on a side of the substrate;
    a semiconductor layer disposed on a side of the shielding layer away from the substrate,
    wherein the shielding layer is at least partially overlapped with the semiconductor layer; and
    a first gate electrode layer disposed on a side of the semiconductor layer away from the substrate,
    the first gate electrode layer is at least partially overlapped with the semiconductor layer and is electrically connected to the shielding layer;
    wherein the display device comprises driving circuits, each of the driving circuits comprises a plurality of thin film transistors, each of the thin film transistors comprise a semiconductor section disposed corresponding to the semiconductor layer, the semiconductor section of at least part of the thin film transistors is overlapped with the shielding layer.

2. The display device as claimed in claim 1, wherein each of the driving circuit comprises first thin film transistors and second thin film transistors, the semiconductor section of the first thin film transistors is overlapped with the shielding layer, and transistor types of the first thin film transistors and the second thin film transistors are different.

3. The display device as claimed in claim 2, wherein the first thin film transistors are low-temperature polycrystalline-silicon thin film transistors, the second thin film transistors are low-temperature polycrystalline-oxide thin film transistors, wherein the semiconductor section of the second thin film transistors is not overlapped with the shielding layer.

4. The display device as claimed in claim 1, wherein the semiconductor section comprises a channel region overlapped with the first gate electrode layer, and the channel region of at least part of the thin film transistors is overlapped with the shielding layer.

5. The display device as claimed in claim 1, wherein a part where the shielding layer overlaps the semiconductor layer and a part where the first gate electrode layer overlaps the semiconductor layer are in a same shape.

6. The display device as claimed in claim 1, wherein the shielding layer and the first gate electrode layer are in a same shape.

7. The display device as claimed in claim 1, wherein the display device comprises a buffer layer and a plurality of functional layers, the buffer layer is disposed on the substrate and covers the shielding layer, the semiconductor layer is disposed on the buffer layer, and the plurality of functional layers are disposed on the buffer layer and covers the semiconductor layer.

8. The display device as claimed in claim 7, wherein a first connection hole is defined in at least one of the functional layers and the buffer layer, and the first gate electrode layer is connected to the shielding layer through the first connection hole.

9. The display device as claimed in claim 7, wherein the plurality of functional layers comprises:
    a first gate insulation layer disposed on the buffer layer and covering the semiconductor layer;
    the first gate electrode layer disposed on the first gate insulation layer and connected to the shielding layer;
    a second gate insulation layer disposed on the first gate insulation layer and covering the first gate electrode layer;

a second gate electrode layer disposed on the second gate insulation layer;

an interlayer insulation layer disposed on the second gate insulation layer and covering the second gate electrode layer;

an electrode layer disposed on the interlayer insulation layer and connected to the semiconductor layer;

a planarization layer disposed on the interlayer insulation layer and covering the electrode layer;

an anode layer disposed on the planarization layer and connected to the electrode layer;

a pixel definition layer disposed on the planarization layer and covering part of the anode layer; and a plurality of spacers disposed on the pixel definition layer, wherein the thin film transistor comprises the first gate electrode layer, the second gate electrode layer, and the electrode layer, and the electrode layer comprises a source electrode and a drain electrode.

10. The display device as claimed in claim 9, wherein a plurality of second connection holes are defined in the second gate insulation layer and the interlayer insulation layer, and the source electrode and the drain electrode are connected to the semiconductor layer through the plurality of second connection holes.

11. The display device as claimed in claim 10, wherein a third connection hole is defined in the planarization layer, the anode layer is connected to the electrode layer through the third connection hole.

12. The display device as claimed in claim 9, wherein the display device comprises an organic light-emitting layer disposed on the plurality of functional layers.

13. The display device as claimed in claim 12, wherein the display device comprises a cathode layer disposed on the organic light-emitting layer.

14. The display device as claimed in claim 13, wherein the display device comprises a driving component electrically connected to the anode layer, the cathode layer, and the thin film transistor.

15. The display device as claimed in claim 1, wherein the shielding layer and the first gate electrode layer has a same electric potential.

16. The display device as claimed in claim 1, wherein the shielding layer comprises at least one metal film layer, the at least one metal film layer is made of at least one or more of molybdenum, titanium, aluminum, silicon, a semiconductor material, or a transparent conductive material.

17. The display device as claimed in claim 1, wherein an area of the shielding layer is greater than an area of the first gate electrode layer.

18. A manufacturing method of a display device, comprising:

disposing a substrate;

disposing a shielding layer on a side of the substrate;

disposing a semiconductor layer on a side of the shielding layer away from the substrate; and disposing a first gate electrode layer on a side of the semiconductor layer away from the substrate, wherein the shielding layer is at least partially overlapped with the semiconductor layer; and the first gate electrode layer is at least partially overlapped with the semiconductor layer and is electrically connected to the shielding layer, and the shielding layer and the first gate electrode layer are made by a same photomask;

wherein an area of the shielding layer is greater than an area of the first gate electrode layer, and the area of the shielding layer and the area of the first gate electrode layer are controlled by photo dose.

* * * * *